(12) United States Patent
Clevenger et al.

(10) Patent No.: US 11,842,961 B2
(45) Date of Patent: Dec. 12, 2023

(54) ADVANCED METAL INTERCONNECTS WITH A REPLACEMENT METAL

(71) Applicant: International Business Machines Corporation, Armonk, NY (US)

(72) Inventors: Lawrence A. Clevenger, Saratoga Springs, NY (US); Kisik Choi, Watervliet, NY (US); Nicholas Anthony Lanzillo, Wynantskill, NY (US); Brent Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 17/412,300

(22) Filed: Aug. 26, 2021

(65) Prior Publication Data

US 2023/0066614 A1   Mar. 2, 2023

(51) Int. Cl.
*H01L 23/528* (2006.01)
*H01L 23/522* (2006.01)
*H01L 21/768* (2006.01)
*H01L 23/532* (2006.01)

(52) U.S. Cl.
CPC ...... *H01L 23/528* (2013.01); *H01L 21/76885* (2013.01); *H01L 23/5226* (2013.01); *H01L 23/53209* (2013.01); *H01L 23/53214* (2013.01); *H01L 23/53228* (2013.01); *H01L 23/53257* (2013.01)

(58) Field of Classification Search
CPC ............. H01L 23/528; H01L 21/76885; H01L 23/5226; H01L 23/53209; H01L 23/53214; H01L 23/53228; H01L 23/53257; H01L 21/76877; H01L 23/53242
See application file for complete search history.

(56) References Cited

U.S. PATENT DOCUMENTS

| | | |
|---|---|---|
| 7,187,085 B2 | 3/2007 | Clevenger |
| 7,476,618 B2 | 1/2009 | Kilpela |
| 7,892,982 B2 | 2/2011 | Lee |
| 9,536,830 B2 | 1/2017 | Bao |

(Continued)

FOREIGN PATENT DOCUMENTS

WO   2015054785 A1   4/2015

OTHER PUBLICATIONS

Fischer, et al., "Low-k Interconnect Stack with multi-layer Air Gap and Tri-Metal-Insulator-Metal Capacitors for 14nm High Volume Manufacturing", ResearchGate, DOI: 10.1109/IITC-MAM.2015.7325600, May 2015, 5 pgs., Logic Technology Department, Corporate Quality Network, Intel Corporation, Hillsboro, OR, USA, <https://www.researchgate.net/publication/303896161>.

*Primary Examiner* — Galina G Yushina
(74) *Attorney, Agent, or Firm* — Edward J. Wixted, III

(57) ABSTRACT

An approach to provide a semiconductor structure using different two metal materials for interconnects in the middle of the line and the back end of the line metal layers of a semiconductor chip. The semiconductor structure includes the first metal material connecting both horizontally and vertically with the second metal material and the second metal material connecting both horizontally and vertically with the first metal material where the second metal material is more resistant to electromigration than the first metal material.

17 Claims, 7 Drawing Sheets

(56) References Cited

U.S. PATENT DOCUMENTS

| | | | |
|---|---|---|---|
| 10,014,256 B2 | 7/2018 | Nelson | |
| 10,256,186 B2 | 4/2019 | Bonilla | |
| 10,490,569 B2 | 11/2019 | Mushiga | |
| 2011/0303528 A1* | 12/2011 | Huang | H01J 37/3417 |
| | | | 204/192.15 |
| 2014/0332963 A1 | 11/2014 | Filippi | |
| 2015/0286765 A1* | 10/2015 | Wang | G03F 1/00 |
| | | | 716/55 |
| 2015/0357316 A1* | 12/2015 | Inagaki | H01L 21/4846 |
| | | | 257/774 |
| 2016/0005691 A1 | 1/2016 | Liu | |
| 2017/0221815 A1* | 8/2017 | Bonilla | H01L 21/76885 |
| 2019/0021176 A1* | 1/2019 | Law | H01L 23/5226 |
| 2019/0035677 A1 | 1/2019 | Chandhok | |
| 2019/0206728 A1 | 7/2019 | Wallace | |
| 2019/0393082 A1* | 12/2019 | Burns | H01L 21/0337 |
| 2020/0075669 A1* | 3/2020 | Chuang | H10B 61/22 |
| 2020/0357692 A1* | 11/2020 | Mignot | H01L 21/76816 |
| 2020/0388567 A1* | 12/2020 | Mignot | H01L 21/31116 |
| 2022/0262723 A1* | 8/2022 | Bao | H01L 21/76885 |

* cited by examiner

ADVANCED METAL INTERCONNECTS WITH A REPLACEMENT METAL

BACKGROUND OF THE INVENTION

The present invention relates generally to the field of semiconductor technology and more particularly to using a subtractive metallization process and two different metals for interconnects in advanced semiconductor devices.

Traditionally, semiconductor interconnects such as horizontal interconnects including lines and power planes, and vertical interconnect access, more commonly known as vias, have been formed in semiconductor devices. Conventional damascene metallization processes for forming vias in semiconductor devices include removing portions of a dielectric material layer to expose one or more portions of an underlying metal layer and depositing a second metal layer over the exposed portions of the underlying metal layer. A planarization process removes excess metal on the dielectric layer to form one or more vias connecting to the underlying metal layer. Typically, a low resistivity metal, such as copper is used to form both the interconnect lines and the vias in the metal layers of a semiconductor device.

SUMMARY

Embodiments of the present invention provide a semiconductor structure using different two metal materials for interconnects in the back end of the line metal layers. The semiconductor structure includes the first metal material connecting both horizontally and vertically with the second metal material and the second metal material connecting both horizontally and vertically with the first metal material where the second metal material is more resistant to electromigration than the first metal material.

Embodiments of the present invention provide a method of forming a skip via composed of the second metal material. The method includes forming one or more vias in a first dielectric material contacting a first metal layer composed of the first metal material and depositing a second metal layer composed of the first metal material over the semiconductor structure. The method includes selectively etching the second metal layer composed of the first metal material to form one or more lines and then, depositing a second metal material over the one or more lines in the second metal layer. Additionally, the method includes selectively etching the second metal material to form a skip via where the skip via connects the first metal layer to a third metal layer. The method includes depositing another layer of a dielectric material over exposed surfaces of the second dielectric layer, the first metal material and the second metal material in the second metal layer, and then, depositing the third metal layer that is connected to the first metal layer by the skip via composed of the second metal material.

BRIEF DESCRIPTION OF THE DRAWINGS

The above and other aspects, features, and advantages of various embodiments of the present invention will be more apparent from the following descriptions taken in conjunction with the accompanying drawings.

DETAILED DESCRIPTION

Figure 1:
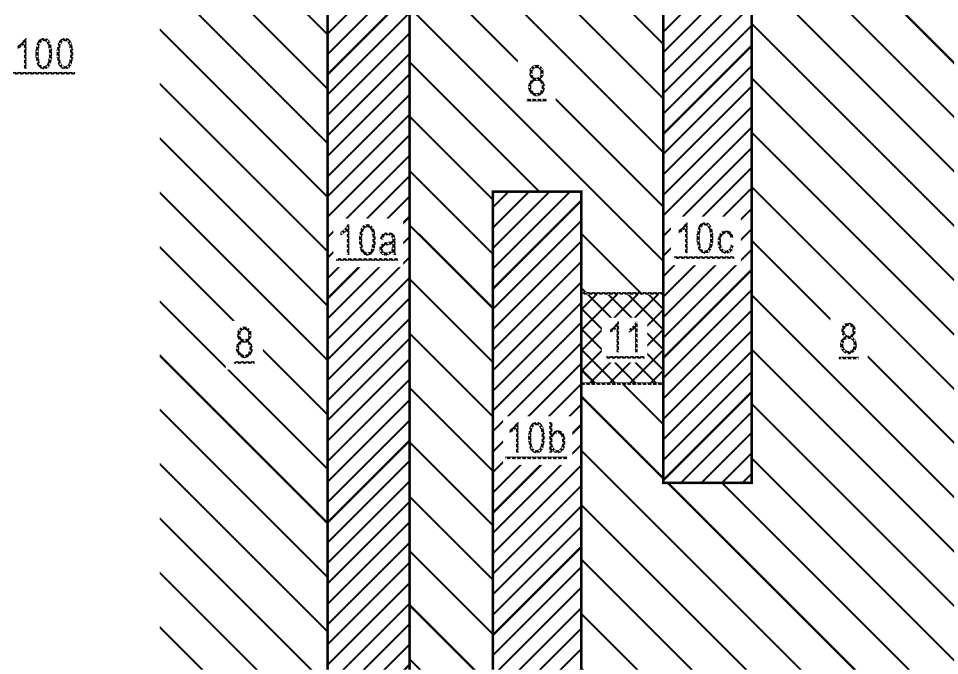
FIG. 1 is a top view of a layer of a semiconductor structure with a single-track jog using a replacement metal, in accordance with an embodiment of the present invention.

Embodiments of the present invention recognize that forming copper lines and vias for semiconductor interconnects using damascene metallization processes is conventional in the backend of the line (BEOL) metal layers. The damascene metallization processes typically include patterning and selectively etching a dielectric material and depositing a layer of copper in the etched holes or trenches to form vias, lines, and power planes followed by a planarization of the top surface of the semiconductor structure to remove excess copper. Embodiments of the present invention recognize that for advanced semiconductor devices using copper as the metallization for lower metal layers of an advanced semiconductor device with very small dimensions in the five to twenty nanometer range will become problematic. As dimensions of interconnect features, such as lines become very small, the lines composed of copper experience a significant increase in resistance. Embodiments of the present invention recognize that using a different metal that may have better electrical resistance with small line and vias dimensions that are less than ten to twenty nanometers would be desirable to attain improved electrical performance in advanced semiconductor devices. Embodiments of the present invention recognize that some metal materials with a higher resistance in relatively thick lines may provide a similar or lower electrical resistance than copper lines in very fine lines and/or vias in the five to ten nanometer range.

Additionally, embodiments of the present invention recognize that with decreasing line widths and line spacing in advanced semiconductor devices, electrical reliability is becoming more challenging with copper. In particular, a decrease in reliability using copper lines with small lines and spacing occurs due to electromigration. Embodiments of the present invention recognize that some higher resistance metals that are not copper provide better reliability and are less susceptible to electromigration fails. Embodiments of the present invention recognize that for some high-reliability systems providing circuits using a more reliable, high resistance metal for some semiconductor device interconnects is desirable.

Embodiments of the present invention recognize that a hybrid metallization approach using more than one metal in the interconnects for the middle of the line (MOL) and back end of the line (BEOL) metal layers may be desirable over a single metal approach for interconnects in advanced semiconductor devices.

Embodiments of the present invention provide a semiconductor structure that includes a first metal material connecting both horizontally and vertically with a second metal material and the second metal material connecting both horizontally and vertically with the first metal material. More specifically, embodiments of the present invention provide one or more lines in each metal layer composed of the first metal material and one or more vias, formed using conventional damascene processes, and also composed of the first metal material. Embodiments of the present invention also provide a single-track jog, which is a short line connecting perpendicular to the majority of the lines in the metal layer, which joins two adjoining lines in the metal layer. The single-track jog is composed of a second metal material.

Additionally, embodiments of the present invention provide a skip via formed with a second metal using lithography and one or more subtractive etch processes to create the skip via. The skip via is on a via connecting to an Mx metal layer. The skip via connects to the Mx+2 metal layer without connecting to the Mx+1 metal layer (e.g., connects the M1 metal layer to the M3 metal layer without contacting the M2 metal layer). As a result of using a subtractive etch process to form the skip via, embodiments of the present invention provide the skip via with a slightly smaller top surface than the bottom surface of the skip via.

Embodiments of the present invention utilize two different metals to form the MOL and BEOL semiconductor structures depicted herein. A first metal material forms conventional vias using conventional damascene via formation (e.g., dielectric material patterning, etch, via metal deposition, and metal planarization) and forms lines using conventional metal materials and processes (e.g., metal deposition, patterning, and etching) for the majority of the horizontal lines in each metal layer as well as a number of the vias vertically connecting adjacent metal layers. Embodiments of the present invention provide a low resistivity metal for the first metal material.

Embodiments of the present invention provide a second metal material that is utilized in one or more single-track jogs and one or more skip vias. A single-track jog is a short horizontal connection between two adjacent lines. As previously discussed, a skip via forming a vertical connection between two non-adjacent metal layers (e.g., Mx metal layer to Mx+2 metal layer). The second metal material can provide one or more of the following properties: resistance to electromigration fails an electrical resistance that increases more slowly than the electrical resistance of the first metal material as line widths decrease in the five to ten nanometer range, a lower electrical resistance, or a higher electrical resistance than the first metal and better resistance to electromigration fails.

Embodiments of the present invention provide an ability to select a second metal material for selected vertical connections and some short horizontal connections that can provide better resistance to electromigration fails for high-reliability semiconductor chip applications. Embodiments of the present invention may provide a second metal material with a better resistance to electromigration fails than the first metal material. The second metal materials with better electromigration fail resistance may also have a higher electrical resistance than the first metal material. Some selected second metal materials may provide a similar electrical resistance to the first metal material when line widths become very fine (e.g., less than 12 nm). An ability to select a second metal material with desired material properties for various vertical and horizontal connections provides additional design flexibility to chip designers for reliability, processing, and electrical performance tradeoffs.

Embodiments of the present invention provide a method of creating interconnects in a MOL or BEOL semiconductor structure using two different metal materials. Embodiments of the present invention provide a method of forming skip vias and single-track jogs using a second metal material that is different than the first metal material used in the majority of the lines in the semiconductor structure and the majority of vias formed with a damascene process. Additionally, embodiments of the present invention provide a method to form a via on top of a line, also known as a top via, using the first metal material. The top via is formed from a thick layer of the first metal deposited on the Mx metal layer to a height that is above the Mx+2 metal layer. The deposited thick layer of the first metal is patterned and selectively etched with a subtractive etch process to form the top via.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for advanced semiconductor devices, and only so much of the commonly practiced process steps are included as are necessary for an understanding of the described embodiments. The figures represent cross-section portions of a portion of an advanced semiconductor device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment," "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper," "lower," "right," "left," "vertical," "horizontal," "top", "bottom," and derivatives thereof shall relate to the disclosed structures and methods, as oriented in the drawing figures. The terms "overlying," "atop," "over," "on "positioned on," or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a top view of a layer of semiconductor structure 100 with single-track jog 11 using a replacement metal in accordance with an embodiment of the present invention. As depicted, FIG. 1 includes dielectric 8, single-track jog 11, lines 10a, 10b, and 10c where lines 10a, 10b, and 10c are composed of a first metal material and single-track jog 11 is composed of a second metal material. In various embodiments, single-track jog 11 connects two adjacent lines in a metal layer. As depicted, single-track jog 11 connects line 10b to line 10c. The two adjacent lines, 10b and 10c, are composed of a different metal material than single-track jog 11.

In various embodiments, the second metal material composing single-track jog 11 has a higher electrical resistance than the first metal material. For example, the first metal material composing lines 10a, 10b, and 10c is a low resistance metal material, such as but not limited to copper and the second metal material is a higher resistance metal, such as but not limited to cobalt or ruthenium. In other embodiments, the first metal material is a medium or high resistance metal material. In one embodiment, the second metal material is low or medium resistance metal material.

In various embodiments, dielectric 8 is an interlevel dielectric (ILD) material deposited above and residing on another metal layer in semiconductor structure 100 (not depicted in FIG. 1). In one embodiment, dielectric 8 is a top surface of a semiconductor substrate. In this embodiment, lines 10a, 10b, 10c, and single-track jog 11 are a portion of the M0 metal layer. As known to one skilled in the art, one or more single-track jogs 11 can be formed in any metal layer of the semiconductor device. For example, single-track jog 11 could be formed in M1 connecting two adjacent lines in the M1 metal layer.

The dimensions of single-track jog 11 scales accordingly with the line width and spacing of the metal layer in which single-track jog 11 resides. For example, if the width of line 10a is 7 nm, the length of single-track jog 11 in the X-X direction from the left to the right between lines 10b and 10c would be a similar length similar to the line width (e.g., approximately 7 nm). The length of single-track jog 11 could be in the range of 5 to 20 nm, for example, in the M1 metal layer. In some embodiments, the length of single-track jog 11 is approximately one-half of the pitch of lines 10b and 10c. In various embodiments, single-track jog 11 is formed using two metal depositions where lines 10a, 10b, and 10c are formed in a layer of the first metal material and a layer of the second metal deposited over the lines 10a, 10b, and 10c to form single-track jog 11. Single-track jog 11 is formed after forming lines 10a, 10b, and 10c using subtractive metallization processes (e.g., single-track jog 11 is formed by patterning the deposited second metal layer using lithography and using a subtractive etching process to form single-track jog 11).

Figure 2:
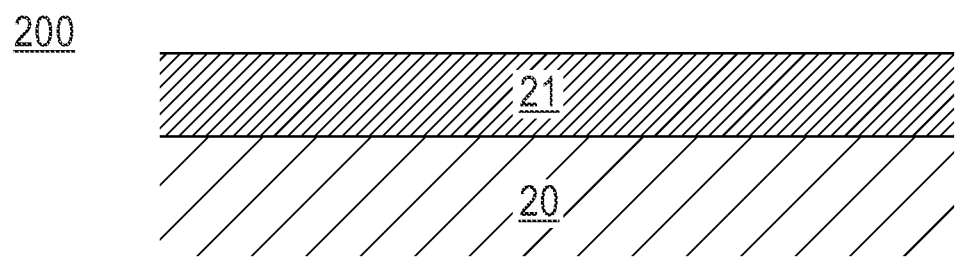
FIG. 2 is a cross-sectional view of a semiconductor structure after a first metal is deposited on a substrate, in accordance with an embodiment of the present invention.

FIG. 2 is a cross-sectional view of semiconductor structure 200 after first metal 21 is deposited on dielectric layer 20, in accordance with an embodiment of the present invention. As depicted, FIG. 2 includes a layer of first metal 21 on the top surface of dielectric layer 20. In various embodiments, dielectric layer 20 is composed of a dielectric material. For example, dielectric layer 20 can be any known dielectric material, such as but not limited to $Al_2O_3$, $SiO_2$, or $Si_3N_4$. Dielectric layer 20 can be the same as dielectric 8 depicted in FIG. 8.

In some embodiments, dielectric layer 20 is a semiconductor substrate. For example, dielectric layer 20 may be composed of silicon (Si), germanium (Ge), another group IV semiconductor material of the Periodic Table of Elements, a group III-V semiconductor material which includes one at least one of a group III semiconductor materials and at least one of a group IV semiconductor material of the Periodic Table of Elements, a group II-VI semiconductor material which includes at least one of a group II semiconductor materials and at least one of a group VI semiconductor material of the Periodic Table of Elements, or other known semiconductor material used in semiconductor devices substrates.

First metal 21 may be composed of a metal material or a metal alloy. For example, first metal 21 can be composed one the following metals or metal alloys including but not limited to Cu, W, Ru, TiN, Co, Al, Rh, Jr, Ni, Ta, and alloys of these metals. In some embodiments, first metal 21 is a low resistivity metal. In one embodiment, first metal 21 is copper but, is not limited to copper. In an embodiment, first metal 21 is a medium to high resistivity metal material or metal alloy. For example, first metal 21 could be tungsten, ruthenium, molybdenum, or cobalt.

First metal 21 may be deposited by ionized plasma vapor deposition (iPVD), PVD or electroplating, for example. In some cases, first metal 21 may be deposited by atomic layer deposition (ALD), plasma-enhanced chemical vapor deposition (PECVD), or another deposition process used in semiconductor manufacturing. In an example, the thickness of the layer of first metal 21, for an M1 metal layer, can range from 10 to 40 nm but is not limited to this range. For example, the thickness of the as deposited layer of first metal 21 can be approximately equal to the desired pitch of the lines formed from first metal 21. In other examples, when a top via is to be formed with first metal 21 above a line in later processing steps, then the thickness of the as deposited layer of first metal 21 can be increased by 10 to 20 nm (e.g., the desired line pitch plus 10 to 20 nm is the deposited height of first metal 21). In various embodiments, the thickness of first metal 21 is application-dependent and varies according to desired line width, line spacing, and the metal material selected. As known to one skilled in the art, line width and spacing can vary depending on the metal layer in the semiconductor device (e.g., lines and spaces in the M1 metal layer are typically finer than lines and spaces in the M5 metal layer). In some embodiments, a chemical mechanical polish (CMP) planarizes the top surface of first metal 21 after deposition.

Figure 3:
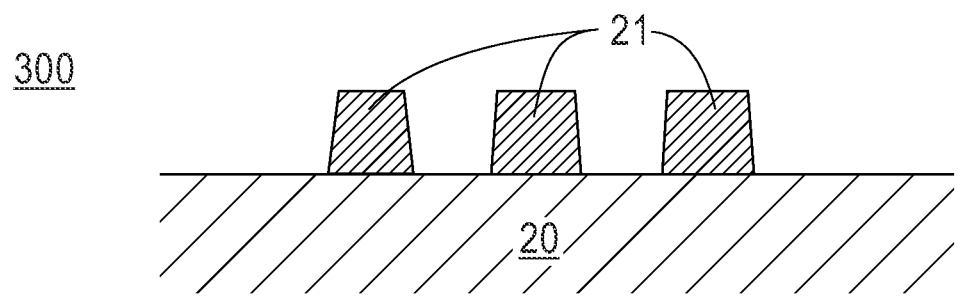
FIG. 3 is a cross-sectional view of the semiconductor structure after patterning and etching the first metal, in accordance with an embodiment of the present invention.

FIG. 3 is a cross-sectional view of semiconductor structure 300 after patterning and etching first metal 21 in accordance with an embodiment of the present invention. As depicted, FIG. 3 includes the elements of FIG. 2 with selected portions of first metal 21 removed using subtractive etching processes. Using known lithography and subtractive etching processes, one or more portions of first metal 21 can be removed. For example, using photolithography or an extreme ultraviolet (EUV) lithography process followed by one or more etching processes, such as but not limited to a dry etching process using a reactive ion etch (RIE), a wet chemical etch process, or a combination of etching processes, the selected portions of first metal 21 can be removed. In some embodiments, the remaining portions of first metal 21 have slightly sloped sides. For example, using subtractive metallization processes after the subtractive etch of first metal 21 may leave the top surfaces of the remaining portions of first metal 21 slightly smaller than the bottom surfaces of first metal 21. In other examples, the sides of first metal 21 are vertical or nearly vertical and the size of the top and bottom surfaces of the remaining portions of first metal 21 are nearly the same.

Figure 4:
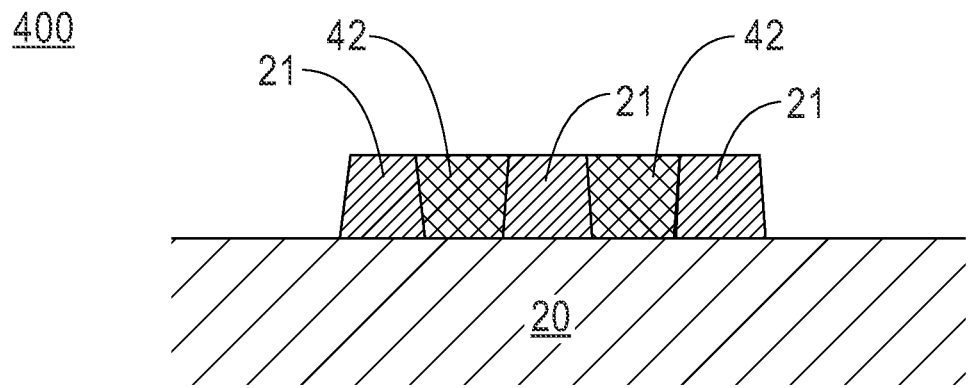
FIG. 4 is a cross-sectional view of the semiconductor structure after depositing and planarizing a second metal, in accordance with an embodiment of the present invention

FIG. 4 is a cross-sectional view of semiconductor structure 400 after depositing and planarizing second metal 42, in accordance with an embodiment of the present invention. As depicted, FIG. 4 includes the elements of FIG. 3 with second metal 42 deposited on exposed portions of dielectric layer 20 and over first metal 21 after a CMP. After the deposition and planarization of second metal 42, the top surface of semiconductor structure 400 is substantially flat, and second metal 42 resides between portions of first metal 21.

Second metal 42 may be composed of a metal material or a metal alloy that is different from first metal 21. For example, second metal 42 can be composed of one of the following metals or metal alloys including but not limited to Cu, W, Ru, Co, Al, Rh, Jr, Ni, and alloys of these metals. In some embodiments, second metal 42 has a higher electrical resistivity than first metal 21. In an embodiment, second metal 42 is a metal material or alloy that provides a similar or lower resistivity than first metal 77 when line sizes become very small (e.g., five to ten nanometers). For example, some metal materials with a high bulk electrical resistance or a high electrical resistance in wide lines (e.g., greater than 50 nanometers) can have an electrical resistance that is slower increase with decreasing cross-sectional areas of features or lines than first metal 77. In one embodiment, second metal 42 is one of cobalt or ruthenium but is not limited to these metals. In one embodiment, second metal 42 has a lower electrical resistivity than first metal 21.

In various embodiments, second metal 42 is a metal material or metal alloy that is less susceptible to electromigration fails. In this case, second metal 42 can provide better semiconductor chip reliability (e.g., due to reduced electromigration fails). Second metal 42 may be deposited by PVD, iPVD, CVD, PECVD, ALD or electroplating, for example. In various embodiments, a chemical mechanical polish (CMP) planarizes the top surface of second metal 42 and first metal 21 after second metal 42 deposition. Due to the subtractive metallization processes that remove portions of first metal 21 to form lines, after CMP, the top surface area of second metal 42 adjacent to the remaining portions of the first metal 21 may be slightly larger than the bottom surface area of second metal 42. For example, the remaining second metal 42 has a slightly trapezoidal shape due to the subtractive etching processes forming first metal 21 as discussed with reference to FIG. 2. After completing the processes discussed with reference to FIGS. 1-7, first metal 21 can composed lines, such as lines 10a, 10b, and 10c depicted in FIG. 1 and second metal 42 can composed the single-track jog, such as single-track jog 11 previously depicted in FIG. 1.

Figure 5A:
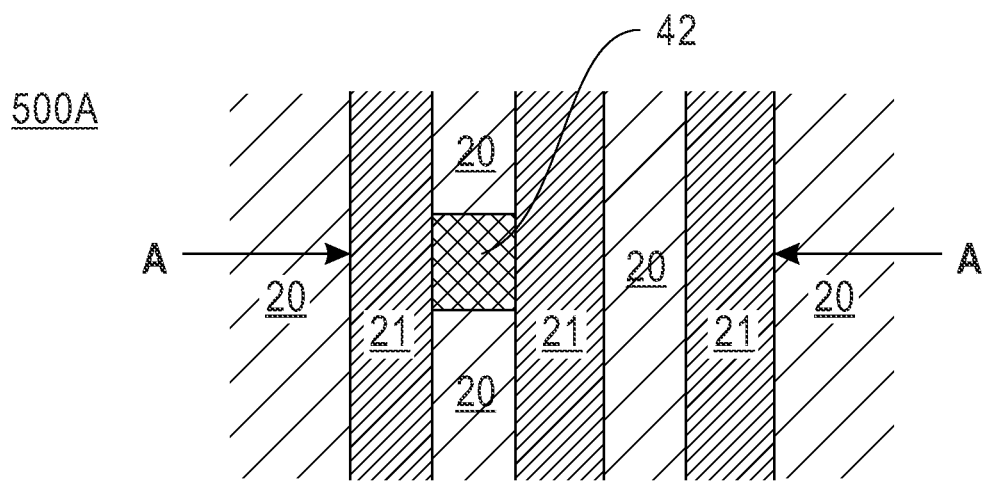
FIG. 5A is a top view of the semiconductor structure after selectively removing portions of the first metal, in accordance with an embodiment of the present invention.

FIG. 5A is a top view of semiconductor structure 500A after selectively removing portions of second metal 42 in accordance with an embodiment of the present invention. As depicted, FIG. 5A includes exposed portions of dielectric layer 20, the remaining portions of first metal 21 which forms lines, and a remaining portion of second metal 42 which forms a single-track jog between two of the lines composed of first metal 21. Also, depicted in FIG. 5A is a location of section A-A depicted in FIG. 5B. The remaining portion of second metal 42 forms a single-track jog, such as single-track jog 11 as previously discussed above with respect to FIG. 1.

Using known a patterning process, such as photolithography or EUV lithography followed by one or more dry and/or wet etching processes, such as RIE, portions of second metal 42 are removed. The remaining portion of second metal 42 bridges or joins adjacent lines formed with first metal 21. As previously discussed, the remaining portion of second metal 42 may have a length that is similar to or the same as a width of the lines formed from first metal 21 (e.g., the length of the single-track jog formed by second metal 42 can match a pitch between the lines formed in the same metal layer). For example, the width of the remaining portion of second metal 42 (i.e., also a length of the single-track jog) can be 7 to 14 nm when the remaining portion of second metal 42 in a first metal layer (M1) of the semiconductor chip. One or more of the single-track jogs can be formed in semiconductor structure 5A. Any metal layer of the semiconductor device formed using semiconductor structure 500A may have one or more single-track jogs depicted as first metal 21 in FIG. 5A. In other examples, second metal 42 is a part of the third metal layer (i.e., the M3 metal layer) and may have a different size. As known to one skilled in the art, feature sizes can vary depending on the metal layer in which the features (e.g., lines, spaces, vias, etc.) reside. Typically, the feature size of lines and spaces increases in higher metal layers.

Figure 5B:
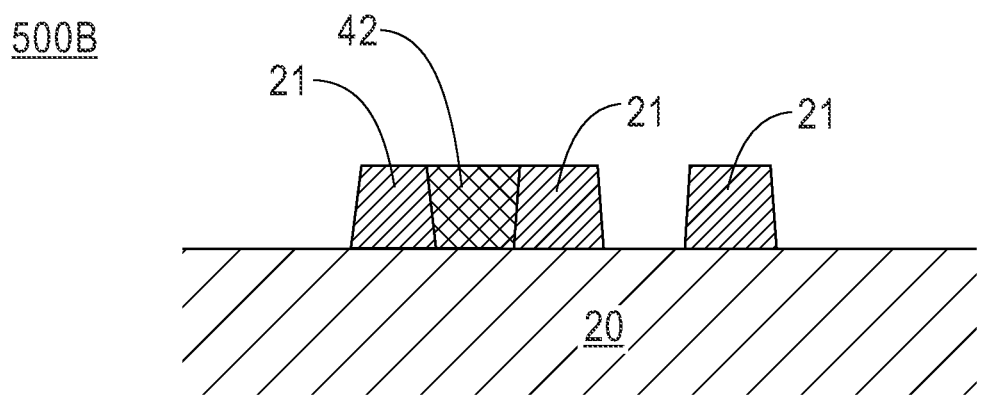
FIG. 5B is a cross-sectional view of the semiconductor structure after selectively removing portions of the second metal, in accordance with an embodiment of the present invention.

FIG. 5B is a cross-sectional view 500B of semiconductor structure 500A after selectively removing portions of second metal 42 in accordance with an embodiment of the present invention. As depicted, FIG. 5B illustrates the cross-section A-A of semiconductor structure 500A in FIG. 5A. FIG. 5B depicts the remaining portion of second metal 42 abutting two of the three lines composed of first metal 21, and dielectric layer 20. As depicted, a portion of dielectric layer 20 is exposed between two portions of first metal 21.

In various embodiments, the subtractive etch processes and subsequent metal deposition processes result in slightly trapezoidal shapes for the remaining portions of first metal 21 that form three lines and the remaining portion of second metal 42. As previously discussed, the top surfaces of the remaining portions of first metal 21 forming lines can be smaller than the bottom surfaces of the remaining portions of first metal 21 and the top surface of the remaining portions of second metal 42 adjacent to the lines formed with first metal 21 are slightly larger than the bottom surfaces of the remaining portions of second metal 42 after patterning and subtractive etching processes.

In summary, a single-track jog can be formed with second metal 42 with the semiconductor processes as described in detail above with respect to FIGS. 2-5B. A layer of first metal 21 is deposited over dielectric layer 20 that can be any ILD material. In some embodiments, first metal 21 is a low electrical resistance metal or metal alloy. First metal 21 is patterned and selectively etched forming lines. A layer of second metal 42 is deposited over exposed surfaces of the dielectric material and the lines formed with first metal 21. Second metal 42 is patterned and selectively etched. The remaining portion of second metal 42 forms a single-track jog as depicted in FIG. 5A that connects adjacent lines composed of first metal 21.

Figure 6:
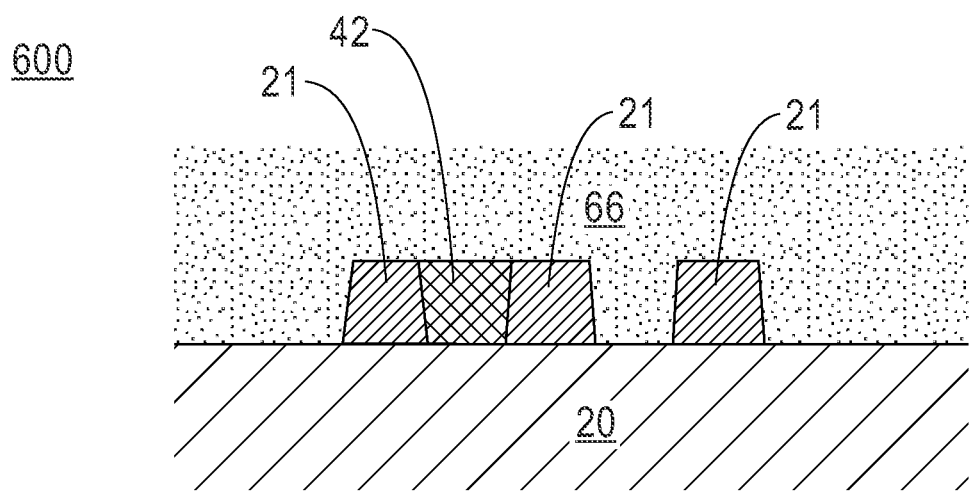
FIG. 6 is a cross-sectional view of the semiconductor structure after depositing a dielectric material over the semiconductor structure, in accordance with an embodiment of the present invention.

FIG. 6 is a cross-sectional view of semiconductor structure 600 after depositing ILD 66, in accordance with an embodiment of the present invention. As depicted, FIG. 6 includes ILD 66 deposited over exposed surfaces of first metal 21, second metal 42, and dielectric layer 20. ILD 66 can be any dielectric material used as an interlevel dielectric material (e.g., $Al_2O_3$, $SiO_2$, etc.) which is deposited using known ILD deposition processes.

As discussed with reference to FIGS. 2-6, the lines composed of first metal 21 and the single-track jog composed of second metal 42 in semiconductor structure 600 can be formed using subtractive metallization processes by depositing first metal 21 on dielectric or in another embodiment, on a semiconductor substrate, then selectively etching first metal 21 followed by the deposition of second metal 42. After a CMP, portions of second metal 42 are selectively removed to form a single-track jog between two portions of first metal 21 (i.e., the single-track jog composed of second metal 42 between the two metal lines composed of first metal 21) and, then a layer of ILD 66 is deposited.

After the deposition of ILD 66, a CMP planarizing the top surface of ILD 66 to expose the top surfaces of the metal lines formed with first metal 21 and the top surface of the single-track jog formed with second metal 42 may occur before depositing another material layer over ILD 66. For example, as known to one skilled in the art, another metal layer may be deposited on ILD 66 and can be patterned to include one or more metal lines composed of first metal 21 and/or one or more single-track jogs composed of second metal 42 (not depicted in FIG. 6).

Figure 7:
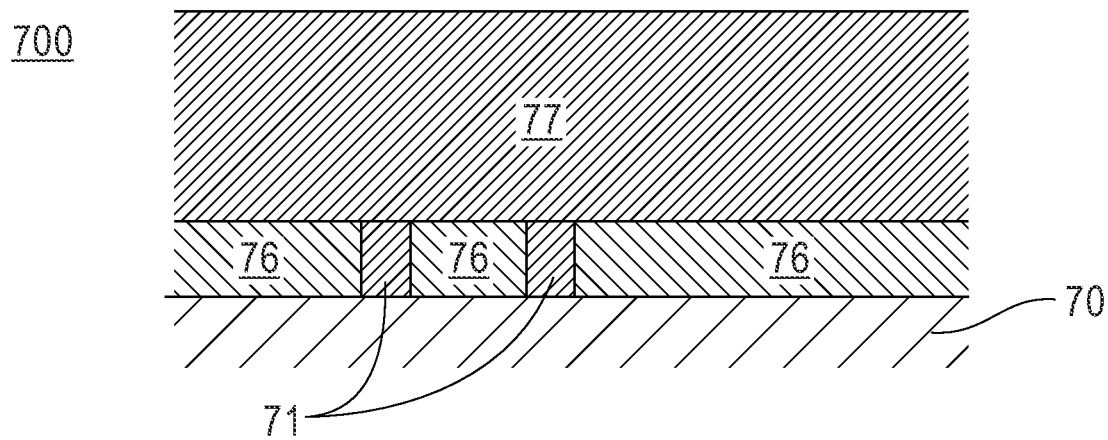
FIG. 7 is a cross-sectional view of a semiconductor structure after depositing a first metal layer over exposed surfaces of an interlayer dielectric (ILD) and vias, in accordance with an embodiment of the present invention.

FIG. 7 is a cross-sectional view of semiconductor structure 700 after depositing first metal 77 over exposed surfaces of ILD 76 and vias 71, in accordance with another embodiment of the present invention. As depicted, FIG. 7 includes metal layer 70, vias 71, ILD 76, and first metal 77.

In various embodiment, metal layer 70 is a metal layer above a semiconductor substrate. For example, metal layer 70 can be the M1 metal layer or in another example, metal layer 70 is the M4 metal layer. In one embodiment, first metal 77 is deposited directly on the semiconductor substrate (not depicted).

Vias 71 may be formed in ILD 76 using conventional via materials, such as but not limited to copper using convention semiconductor damascene via formation processes (e.g., etch of ILD 76, deposition of metal for via 71 over metal layer 70, followed by a CMP to remove excess via metal). ILD 76 may be any ILD material, such as but not limited to $SiO_2$.

In various embodiments, first metal 77 is the same metal material or metal alloy as first metal 21. For example, first metal 77 can one of copper, aluminum, tungsten, ruthenium, cobalt, iridium, rhodium, or nickel but is not limited to these metals. In some embodiments, first metal 77 is a low resistivity metal, such as copper. In other embodiments, first metal 77 is a medium or high resistance metal or metal alloy (e.g., cobalt).

First metal 77 can be deposited using any of the deposition processes previously discussed with respect to FIG. 2. A thickness of first metal 77 can vary depending on the metal layer in which first metal 77 is a portion of the semiconductor chip. For example, when first metal 77 is deposited on ILD 76 and a via 71 contacting the M1 metal layer as metal layer 70, the thickness of the deposited first metal layer can range from 15 to 60 nm but is not limited to these thicknesses. For example, first metal 77 can be approximately 10 to 40 nm when forming a line, such as line 77C, or can be 20 to 60 nm when forming a line (e.g., line 77C) with a top via, such as top via 77B above line 77C as depicted later in FIG. 9B but is not limited to these ranges. A CMP may be performed to planarize the surface of first metal 77.

Figure 8:
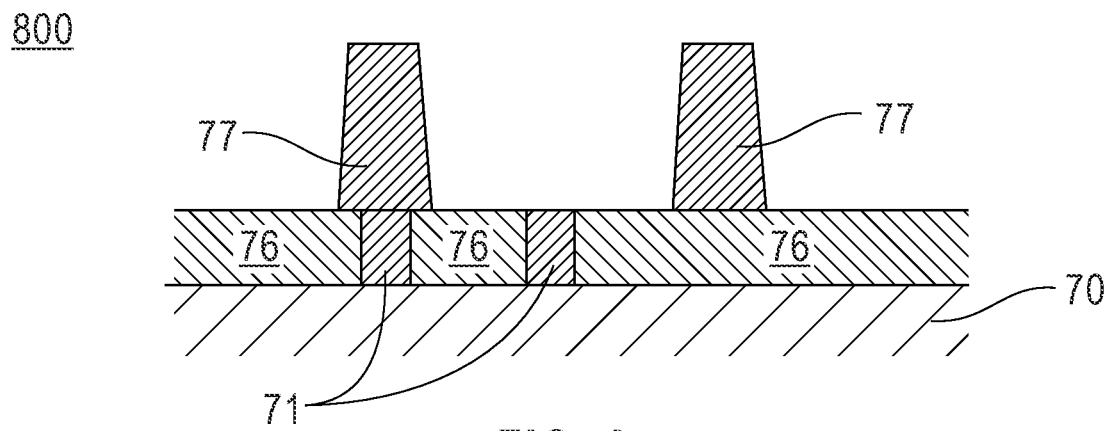
FIG. 8 is a cross-sectional view of the semiconductor structure after a first selective etch of the first metal layer, in accordance with an embodiment of the present invention.

FIG. 8 is a cross-sectional view of semiconductor structure 800 after selectively etching first metal 77 in accordance with an embodiment of the present invention. As depicted, FIG. 8 includes the elements of FIG. 7. The deposited first metal 77 is patterned using conventional lithography (e.g., photolithography or EUV lithography) and etched using one or more wet or dry etch processes, such as RIE. After selectively etching first metal 77, one or more portions of first metal 77 remain. As depicted in FIG. 8, at least one of the remaining portions of first metal 77 resides on one of vias 71 connecting to metal layer 70.

Figure 9A:
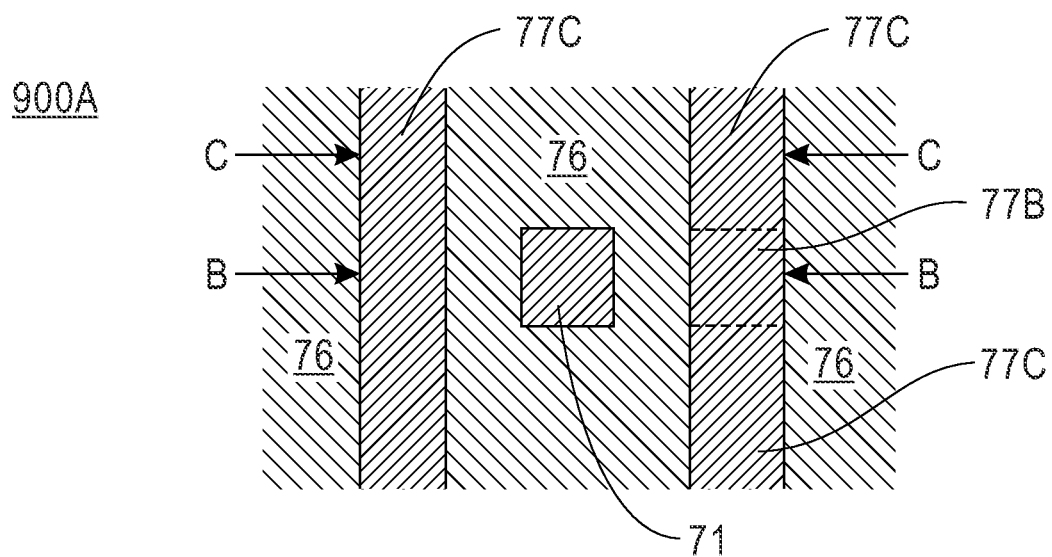
FIG. 9A is a top view of the semiconductor structure after a second selective etch of the first metal layer, in accordance with an embodiment of the present invention.

FIG. 9A is a top view of semiconductor structure 900A after a second selective etch of first metal 77 in accordance with an embodiment of the present invention. As depicted, FIG. 9A includes one of vias 71, ILD 76, first metal 77 forming two lines labeled as lines 77C, and a remaining unetched portion of first metal 77 that forms a top via 77B on the right-side line of the two lines labeled lines 77C. A top via is a via that is formed using a subtractive etch process on top of a line or portion of a power plane. Top via 77B is formed from the same metal layer (e.g., first metal 77) as the metal deposited for the line or a power plane the top via resides on. The top surface of first metal 77 is patterned using known lithography processes, such as EUV and then, selectively etched for example with RIE, a wet etch, or a combination of etching processes to form two parallel lines labeled as lines 77C and top via 77B on the right-side line 77C. Top via 77B is identified by the dotted lines in FIG. 9A.

A top portion of as deposited first metal 77 can be patterned and selectively removed to form a portion of first metal 77 that is not selectively etched in the first etch of first metal 77 (e.g., discussed above with reference to FIG. 8) that forms top via 77B depicted on the right-side line 77C. A second selective subtractive metallization process forms lines 77C as depicted in FIG. 9A. While one top via 77B is depicted in FIG. 900A, any number of top vias 77B may be formed on lines 77C. The locations of cross-sections B-B and C-C are also illustrated on FIG. 900A. While via 71 is depicted in FIG. 9A is a square, in other embodiments, via 71 will have a circular or an oval shape.

Figure 9B:
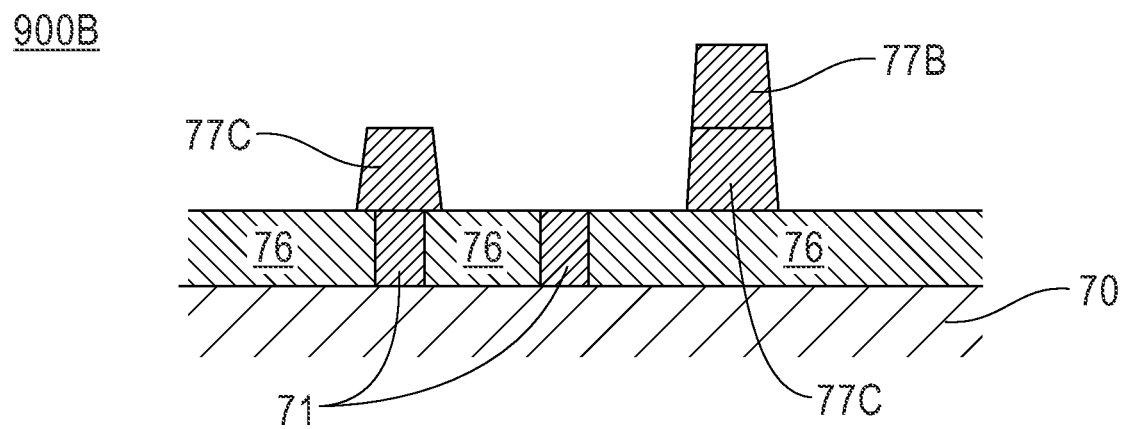
FIG. 9B is a cross-sectional of the semiconductor structure through cross-section B-B of FIG. 9A after the second selective etch of the first metal, in accordance with an embodiment of the present invention.

FIG. 9B is a cross-sectional view semiconductor structure 900B through cross-section B-B of FIG. 9A after the second selective etch of first metal 77 in accordance with an embodiment of the present invention. FIG. 9B is the cross-sectional view through cross-section B-B in FIG. 9A. As depicted, FIG. 9B includes metal layer 70, vias 71, ILD 76, lines 77C formed from first metal 77, and top via 77B where lines 77C and top via 77B are also composed of first metal 77. In one example, lines 77C form a portion of the M2 metal layer. In other examples, lines 77C can form a portion of the M3 metal layer or lines in any other metal layer of the semiconductor chip.

Figure 9C:
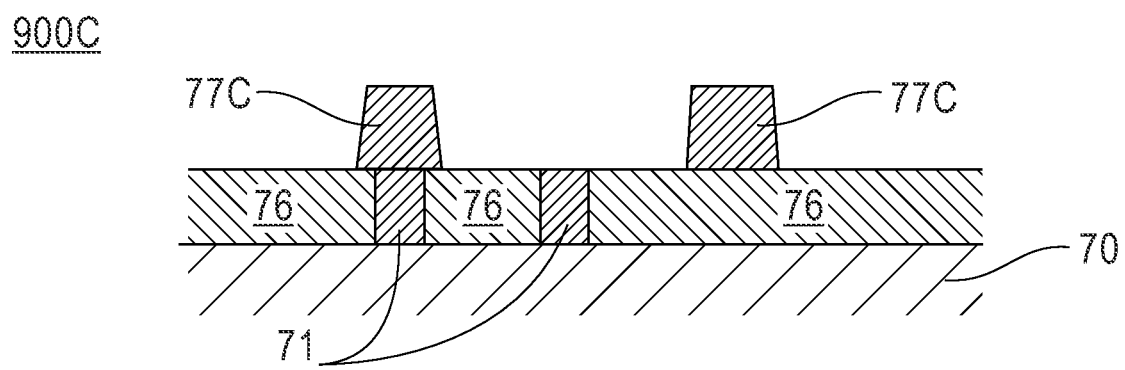
FIG. 9C is a cross-sectional of the semiconductor structure through cross-section C-C of FIG. 9A after the second selective etch of the first metal, in accordance with an embodiment of the present invention.

FIG. 9C is a cross-sectional view semiconductor structure 900C of cross-section C-C depicted in FIG. 9A in accordance with an embodiment of the present invention. As depicted, FIG. 9C includes two lines 77C that are each on one of vias 71 or on ILD 76. Lines 77C can be lines formed in any metal layer by the second selective etch of first metal 77 after the first selective etch of first metal 77 forms top via 77B. For example, lines 77C are in the M2 metal layer above metal layer 70 which is the M1 metal layer. In this example, a width of lines 77C can range from 5 to 20 nm but is not limited to these widths.

Figure 10:
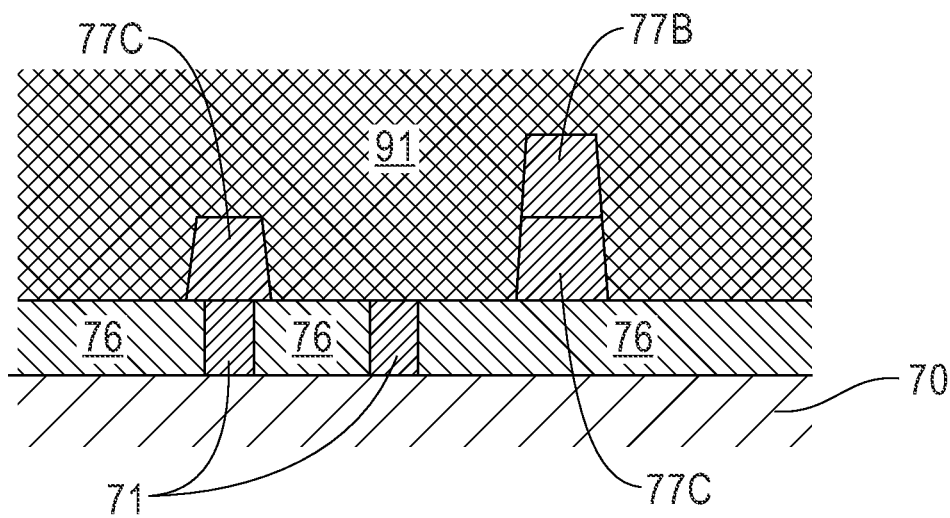
FIG. 10 is a cross-sectional view of the semiconductor structure after depositing a second metal layer over exposed surfaces of an interlayer dielectric (ILD), a via, and the remaining portions of the first metal layer, in accordance with an embodiment of the present invention.

FIG. 10 is a cross-sectional view of semiconductor structure 1000 after depositing second metal 91 over exposed surfaces of ILD 76, one of vias 71, lines 77C, and top via 77B in accordance with an embodiment of the present invention. As depicted, FIG. 10 includes the elements of FIG. 9B and second metal 91. In various embodiments, a CMP planarizes the top surface of second metal 91. Second metal 91 can be composed of any of the metal materials or metal alloys used for second metal 42. For example, second metal 91 can be selected to be as metal, such as cobalt to provide better resistance to electromigration fails. Second metal 91 can be deposited with any of the same processes described in detail with reference to FIG. 4 to deposit second metal 42. After the deposition of second metal 91, a CMP may planarize the top of second metal 42 leaving level top surfaces of top via 77B and second metal 91 as depicted in FIG. 10.

As depicted, second metal 91 extends from a top surface of one of vias 71 connecting to metal layer 70 to a height that is at least equivalent to the bottom surface of the next metal layer above lines 77C (not depicted in FIG. 10). For example, in the M1 metal layer a height or thickness of the deposited second metal can range from 20 to 60 nm but is not limited to this range (e.g., can be more than 60 nm).

Figure 11A:
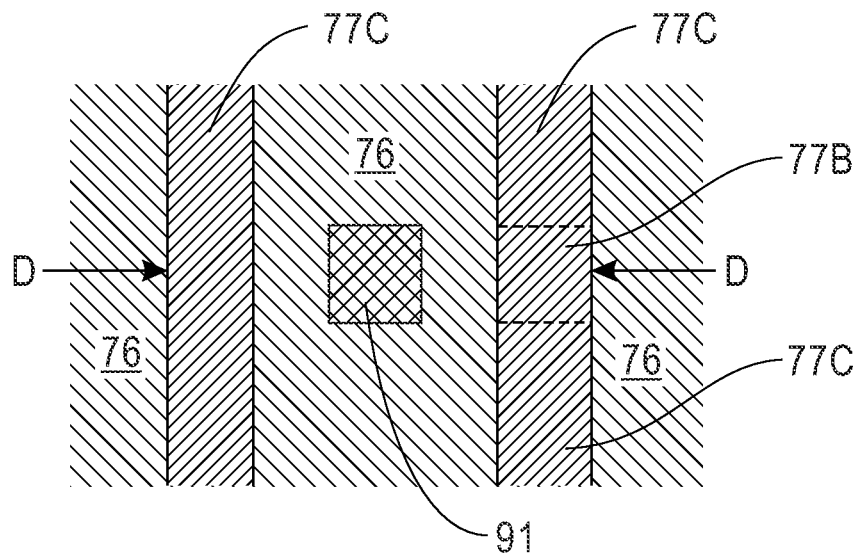
FIG. 11A is a top view of the semiconductor structure after selectively removing portions of the second metal layer, in accordance with an embodiment of the present invention.

FIG. 11A is a top view of semiconductor structure 1100A after selectively removing portions of second metal 91, in accordance with an embodiment of the present invention. As depicted, FIG. 11A includes ILD 76, lines 77C, top via 77B depicted by the dotted lines, and the remaining portion of second metal 91. Second metal 91 can be patterned and selectively etched using one or more of the processes previously discussed with respect to FIG. 5A (e.g., patterned with lithography and etched with RIE and/or a wet etch process). As depicted, FIG. 11A illustrates the location of cross-section D-D. In some embodiments, a CMP planarizes semiconductor structure 1100A after patterning and selectively etching second metal 91.

In various embodiments, second metal 91 forms a skip via capable of connecting one of vias 71 on metal layer 70 to the next metal layer in the semiconductor chip. As previously discussed, a skip via connects two non-adjacent metal layers, such as M1 to the M3 metal layer without connecting to a line in M2 (e.g., skips connecting to the M2 metal layer). The skip via is on a via, such as via 71 connecting to metal layer 70, which may be the M1 metal layer. The skip via formed with second metal 91 on via 71 may connect two non-adjacent metal layers (e.g., M1 and M3). While the top surface of the skip via formed by patterning and selectively etching second metal 91 is depicted as a square, in other examples, the top surface of the remaining portion of second metal 91 creating the skip via could have a round shape, an oval shape, or a rounded rectangular shape and the skip via formed from second metal 91 can have a wider bottom cone shape or a slight pyramid shape with a smaller square or rectangular top surface and a slightly larger bottom surface where the skip via rests on or contacts via 71.

Figure 11B:
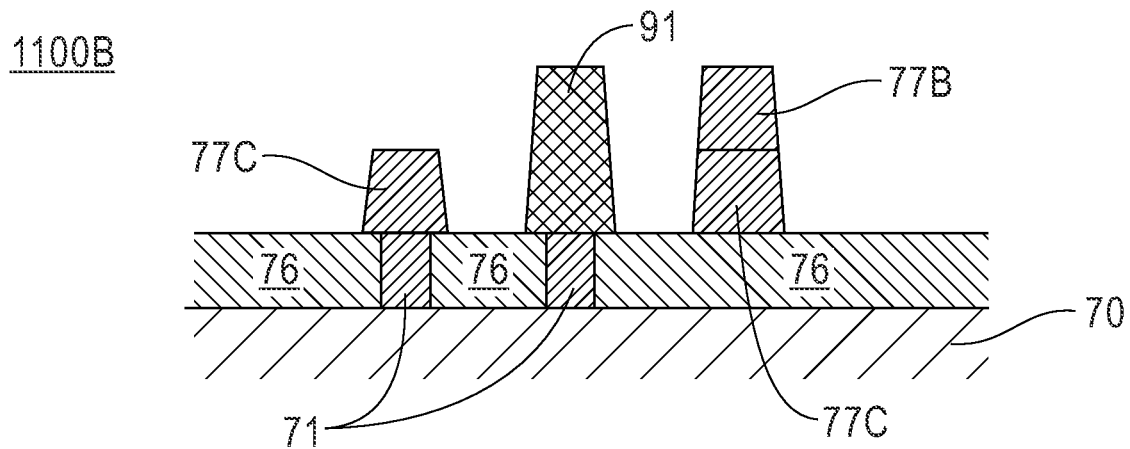
FIG. 11B is a cross-sectional view of the semiconductor structure after selectively removing portions of the second metal layer, in accordance with an embodiment of the present invention.

FIG. 11B is a cross-section 1100B through cross-section D-D depicted in FIG. 11A after selectively removing portions of second metal 91 in accordance with an embodiment of the present invention. As depicted, FIG. 11B includes the remaining portion of second metal 91, lines 77C, top via 77B, ILD 76, vias 71, and metal layer 70. As depicted, the space between each of lines 77C and the remaining portion of second metal 91 are the same. In other examples, the space between second metal 91 and lines 77C is different and can vary.

Figure 12:
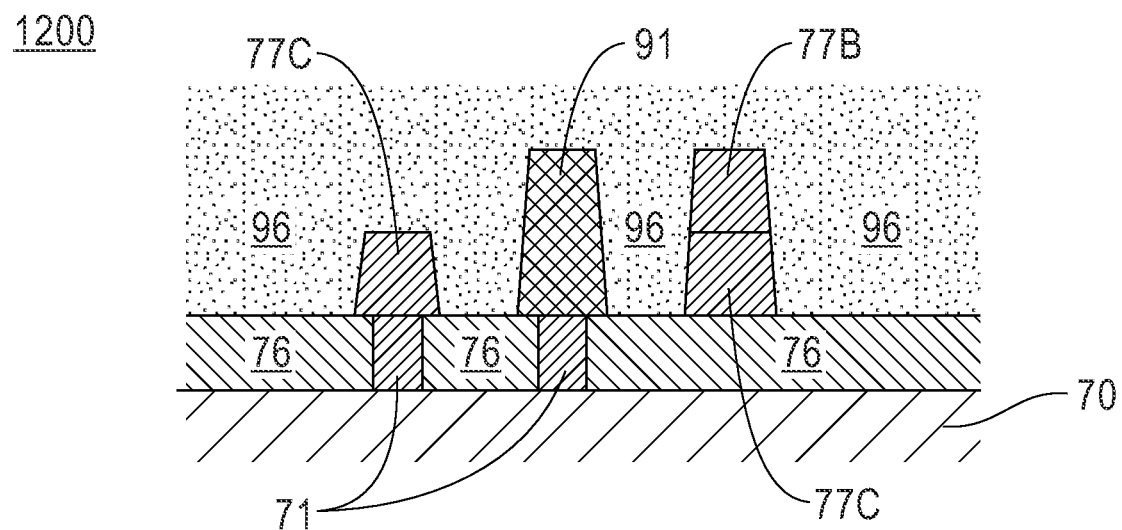
FIG. 12 is a cross-sectional view of the semiconductor structure after depositing a layer of ILD over the top surface of the semiconductor, in accordance with an embodiment of the present invention.

FIG. 12 is a cross-sectional view of semiconductor structure 1200 after depositing a layer of ILD 96 over the exposed surfaces of ILD 76, lines 77C, top via 77B, and second metal 91 in accordance with an embodiment of the present invention. As depicted, FIG. 12 includes the elements of FIGS. 11A and 11D 96. Using known ILD materials, such as $SiO_2$, and known ILD deposition processes, such as but not limited to PVD, a layer of ILD 96 is deposited. ILD 96 extends above the surface of second metal 91 and fills the trenches between second metal 91 and lines 77C with top via 77B. ILD 96 surrounds second metal 91 forming a skip via, lines 77C, and top via 77B and is over exposed surfaces of ILD 76.

Figure 13:
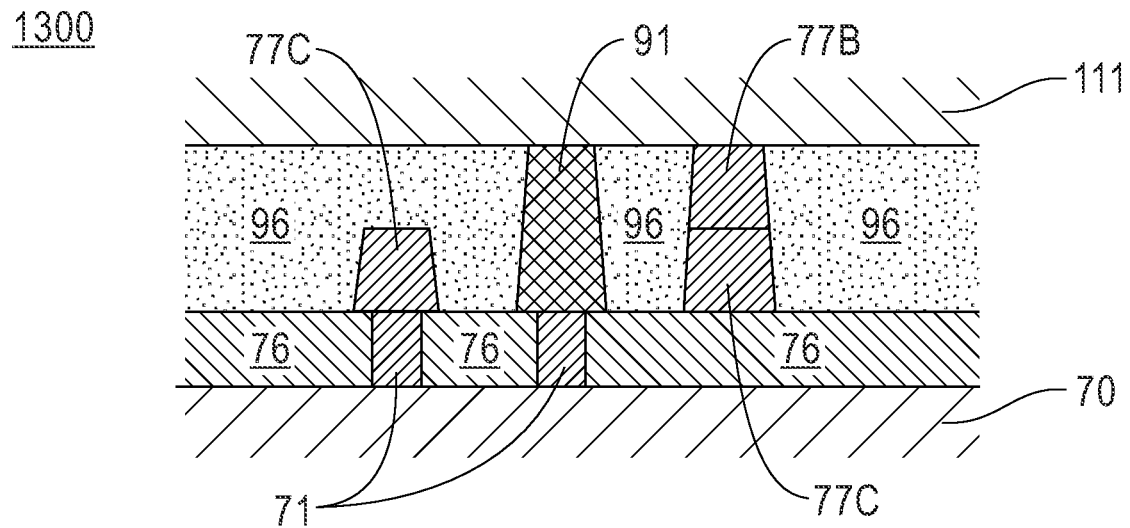
FIG. 13 is a cross-sectional view of the semiconductor structure after depositing another metal layer over the ILD and the second metal layer, in accordance with an embodiment of the present invention.

FIG. 13 is a cross-sectional view of semiconductor structure 1300 after depositing metal layer 111 on ILD 96, top via 77B, and second metal 91 in accordance with an embodiment of the present invention. As depicted, FIG. 13 includes metal layer 70, vias 71, ILD 76, ILD 96, lines 77C, top via 77B, second metal 91 which forms a skip via, and metal layer 111. Metal layer 111 can be deposited after performing a CMP. The CMP may be performed to planarize the top surface of ILD 96. After the CMP, the top surfaces of ILD 96, second metal 91 and top via 77B are exposed. The CMP removes portions of ILD 76 and may remove the top portion of second metal 91 and top via 77B. As depicted in FIG. 13, the top surface of the skip via composed of second metal 91, the top surface of ILD 76, and the top surface of top via 77B are substantially the same height. The height of the remaining portions of second metal 91 forming the skip via and first metal 77 forming top via 77B is consistent with a vertical space between a metal layer, such as the M2 metal layer with lines 77C and the adjacent metal layer, such as M3. In other words, after planarization, a height of the skip via composed of second metal 91 extends up to a height that will allow the skip via composed of second metal 91 to connect with a next metal layer, such as metal layer 111 that will be deposited above the skip via.

After the CMP, using known metal deposition processes as previously discussed with respect to FIG. 2, metal layer 111 can be deposited over the top surfaces of ILD 96, second metal 91, and skip via 91B. Metal layer 111 can be composed of any of the metal materials or metal alloys previously discussed in detail with respect to first metal 77 in FIG. 2 and may be deposited using any of the deposition processes discussed with respect to FIG. 2. For example, metal layer 111 may be composed of a lower resistivity metal, such as copper, deposited by iPVD to form metal layer 111.

Metal layer 111 can form any metal layer in the semiconductor chip using known semiconductor manufacturing processes. For example, metal layer 111 may be the M3 metal layer. In this example, one of vias 71 connects the remaining portion of second metal 91 to metal layer 70 where metal layer 70 is the M1 metal layer. In this way, second metal 91 forms the skip via using one of vias 71 connecting the M1 metal layer to the M3 metal layer without using a connection to the M2 metal layer (i.e., skips connecting to the M2 metal layer). In other examples, the skip via composed of second metal 91 connects the M2 metal layer to the M4 metal layer when the skip via resides above a via connecting to the M2 metal layer or in another example, connects the M0 layer to the M2 metal layer when the skip via resides on a via connecting to the M0 metal layer.

As previously discussed, second metal 91 can be a higher resistance metal that makes vertical connections from a via contacting one metal layer, such as the Mx metal layer to a Mx+2 metal layer and second metal 91 forming the skip via does not directly contact the Mx+1 metal layer (e.g., provide a connection to a via on the M1 metal layer to the M3 metal layer without directly connecting to the M2 metal layer). As previously discussed, in various embodiments, second metal 91 can be a metal material that is more resistant to electromigration fails than first metal 77. In some embodiments, the electrical resistance of second metal 91 does not increase as rapidly as the electrical resistance of first metal 77 when feature sizes, such as line width decrease (e.g., particularly, as feature sizes and lines are approaching 7 nm and below). In some examples, first metal 77 is a lower resistance metal forming horizontal connections or lines 77C within a metal layer and vertical connections, such as vias 71 and top via 77B.

In various embodiments, lines or power planes are formed in metal layer 111. In some embodiments, metal layer 111 is composed of first metal 77 and can be selectively etched and then, another metal layer composed of second metal 91 deposited over metal layer 111 and exposed portions of ILD 96 to form one or more single-track jogs or to form skip vias using the processes discussed above with respect to FIGS. 1-13.

In summary, a skip via composed of second metal 91 can be formed with the semiconductor manufacturing processes as previously described in detail above with respect to FIGS. 7-13. A layer of first metal 77 which may be a low resistance metal or metal alloy is deposited over a dielectric material, such as ILD 76 and at least one via, such as one of vias 71. Via 71 contacts metal layer 70 directly below ILD 76. First metal 77 is patterned and selectively etched forming lines 77C. A layer of second metal 91 is deposited over exposed surfaces of ILD 76, via 71, and lines 77C formed with first metal 77. Second metal 91 is patterned and selectively etched. The remaining portion of second metal 91 above one of vias 71 can form a skip via. A layer of a second ILD material, ILD 96 is deposited over ILD 76, lines 77C, and the remaining portion of second metal 91 forming the skip via. A CMP may be performed exposing a top surface of second metal 91 and lines 77C in ILD 96. Another metal layer, such as metal layer 111 composed of first metal 77 can be deposited on exposed surfaces of ILD 96, lines 77C, and the remaining portion of second metal 91 forming the skip via. The skip via residing on one of vias 71, as previously discussed, can connect to the Mx metal by via 71 to the Mx+2 metal layer where the skip via is composed of second metal 91. In various embodiments, each of the Mx metal layer of metal layer 70, vias 71, and lines 77C, and metal layer 111 which can be the Mx+2 metal layer above the skip via are composed of first metal 77.

Figure 14:
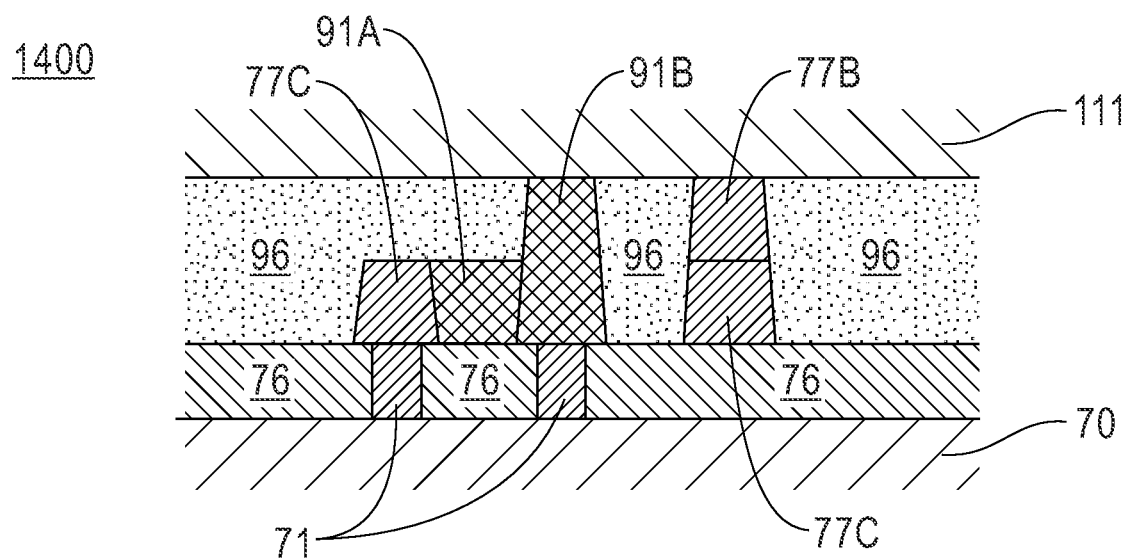
FIG. 14 is a cross-sectional view of the semiconductor structure after depositing the another metal layer over both a single-track jog and a skip via using the second metal layer, in accordance with an embodiment of the present invention.

FIG. 14 is a cross-sectional view of semiconductor structure 1400 after depositing metal layer 111 over via 91B, ILD 96, and top via 77B in accordance with an embodiment of the present invention. As depicted, FIG. 14 includes single-track jog 91A and skip via 91B formed with second metal 91, lines 77C, top via 77B, metal layer 70, vias 71, ILD 76, ILD 96, and metal layer 111. In FIG. 14, two different metal materials, where the two metal materials include metal alloys, form the electrical connections in semiconductor structure 1400. While FIG. 14 depicts single-track jog 91A between via 91B and one of lines 77C, in other examples, depicted in FIGS. 1-6, a single-track jog such as single-track jog 91A can connect two adjacent lines such as lines 77C.

As depicted, one of lines 77C connects both horizontally using single-track jog 91A and vertically using via 91B from metal layer 70 to metal layer 111. In FIG. 14, skip via 91B and single-track jog 91A which are composed of second metal 91 provide both vertical and horizontal connections to one or more of vias 71, lines 77C, and/or metal layer 111 composed of first metal 77. Single-track jog 91A and via 91B can be composed of second metal 91 and lines 77C, vias 71, and metal layer 111 can be composed of first metal 77. In this example, a line 77C composed of first metal 77 in a metal layer, such as the M2 metal layer, connects to both via 71 composed of first metal 77 and a single-track jog 91A composed of second metal 91 and a second line 77C connects with metal layer 111 and via 71 contacting metal layer 70 composed of first metal 77. In FIG. 14, a hybrid metal-semiconductor structure using two different metal materials for both vertical and horizontal electrical connections in BEOL or MOL interconnects is created. By providing semiconductor structure 1400 and the method of forming semiconductor structure 1400 as discussed with reference to FIGS. 1-14, semiconductor structure 1400 can be customized by the semiconductor chip designer to provide both the desired electrical performance and the desired reliability by using two selected metal materials for BEOL or MOL interconnects. In FIG. 14, each of the selected metal materials can provide both vertical and horizontal connections in semiconductor structure 1400. Each of the selected metal materials can provide the desired reliability in terms of electromigration, for example, and/or the desired electrical performance by using different electrical resistance metal materials or using a metal material with a slower increase in electrical resistance as line widths decrease (e.g., in the less ten nanometer range).

In an embodiment, a single-track jog composed of second metal 91 connects to one of lines 77C composed of first metal 77 and a second line 77C composed of first metal 77.

In this embodiment, a line 77C composed of first metal 77 in a metal layer, such as the M3 metal layer, connects to both a via composed of second metal 91 and a single-track jog composed of second metal 91.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The methods as described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor comprising:
   a first metal material in a metal layer, wherein the first metal material includes two lines connected horizontally by a second metal material between the two lines in the metal layer; and
   the second metal material is a single-track jog between the two lines.

2. The semiconductor structure of claim 1, wherein the second metal material is more resistant to electromigration.

3. The semiconductor structure of claim 1, wherein the second metal material has a higher resistivity than the first metal material, wherein both the second metal material and the first metal material include metal alloys.

4. The semiconductor structure of claim 1, wherein the single-track jog has a top surface that is larger than a bottom surface of the single-track jog, and wherein the top surface of the second metal material and a top surface of the two lines is flat.

5. The semiconductor structure of claim 1, wherein the second metal material includes a material selected from the group consisting of tungsten, ruthenium, cobalt, aluminum, copper, rhodium, iridium, and nickel.

6. The semiconductor structure of claim 1, wherein the single-track jog between the two lines is perpendicular to the two lines in a plan view.

7. The semiconductor structure of claim 1, wherein an electrical resistance of the second metal material does not increase as rapidly as the electrical resistance of first metal material when a line width of the second metal material is equal to or less than 7 nanometers.

8. The semiconductor structure of claim 1, wherein the single-track jog has sides abutting sides of the two lines.

9. The semiconductor structure of claim 1, wherein the first metal material is copper and the second metal material is ruthenium.

10. A semiconductor structure comprising:
    a first metal layer composed of a first metal material;
    a first via composed of the first metal material in a first interlevel dielectric material on the first metal layer;
    a first line composed of the first metal material in a second metal layer; and
    a single-track jog composed of a second material connects the line to a second via, wherein the second via composed of the second metal material in a second interlevel dielectric layer connects the first via to a third metal layer composed of the first metal material.

11. The semiconductor structure of claim 10, wherein the first via composed of the first metal material connects the second via composed of the second metal material to the first metal layer.

12. The semiconductor structure of claim 10, wherein the single-track jog connects horizontally with the first line and vertically with both the first metal layer and the third metal layer by the first via and the second via.

13. The semiconductor structure of claim 10, wherein the single-track jog is perpendicular to the first line in a plan view.

14. The semiconductor structure of claim 10, further comprising:
    a second line composed of the first metal material in the second metal layer; and
    at least one top via composed of the first metal material directly on a portion of the second line, wherein the at least one top via contacts the second line to the third metal layer.

15. The semiconductor structure of claim 10, wherein an electrical resistance of the second metal material does not increase as rapidly as the electrical resistance of first metal material when a line width of the second metal material is equal to or less than 7 nanometers.

16. The semiconductor structure of claim 10, wherein the first metal material is copper and the second metal material is ruthenium.

17. The semiconductor structure of claim 10, wherein the second metal material horizontally connects to the first line composed of the first metal material, and wherein the second metal material directly contacts the first via composed of the first metal material and the third metal layer composed of the first metal material.

* * * * *